(12) United States Patent
Hu et al.

(10) Patent No.: US 10,937,352 B2
(45) Date of Patent: Mar. 2, 2021

(54) PIXEL STRUCTURE, METHOD OF MANUFACTURING THE SAME, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Yue Hu, Beijing (CN); Xinxin Wang, Beijing (CN); Chunjing Hu, Beijing (CN); Lifang Song, Beijing (CN); Zhijie Ye, Beijing (CN); Lingyun Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei Anhui (CN)

( * ) Notice: Subject to any disclaimer, the term of this patent is extended or adjusted under 35 U.S.C. 154(b) by 340 days.

(21) Appl. No.: 16/092,074

(22) PCT Filed: Jan. 5, 2018

(86) PCT No.: PCT/CN2018/071551
§ 371 (c)(1),
(2) Date: Oct. 8, 2018

(87) PCT Pub. No.: WO2018/205662
PCT Pub. Date: Nov. 15, 2018

(65) Prior Publication Data
US 2021/0027691 A1    Jan. 28, 2021

(30) Foreign Application Priority Data

May 12, 2017    (CN) .......................... 201710335252.3

(51) Int. Cl.
*G09G 3/20*    (2006.01)

(52) U.S. Cl.
CPC .... *G09G 3/2003* (2013.01); *G09G 2300/0452* (2013.01)

(58) Field of Classification Search
CPC .. G09G 3/2003; G09G 3/2051; G09G 3/2074; G09G 3/3607; G09G 2300/0452; G09G 2320/0242
(Continued)

(56) References Cited

U.S. PATENT DOCUMENTS 9,638,951 B2 *  5/2017  Wang ................ G02F 1/133514
10,417,979 B2 *  9/2019  Xu ......................... G02F 1/1368
(Continued)

FOREIGN PATENT DOCUMENTS

CN    202887618 U    4/2013
CN    104299523 A    1/2015
(Continued)

OTHER PUBLICATIONS

First Office Action for CN Appl. No. 201710335252.3, dated Jul. 2, 2018.
(Continued)

*Primary Examiner* — Tom V Sheng
(74) *Attorney, Agent, or Firm* — Dinsmore & Shohl LLP

(57) ABSTRACT

The present application relates to a pixel structure, a method for manufacturing the same, a display panel and a display device. The pixel structure includes a plurality of sub-pixels, each of which has a triangular shape. Sub-pixels of four different colors constitute a pixel unit. Any two sub-pixels that have the same common triangle edge have different colors. Each row and each column of sub-pixels are composed of alternately arranged upright triangle sub-pixels and inverted triangle sub-pixels. Every adjacent six columns of
(Continued)

sub-pixels constitute a group. Each row of sub-pixels includes sub-pixels of four different colors, and each group of sub-pixels has the same arrangement. The upright triangle sub-pixels are sub-pixels of the other three different colors, and all of the inverted triangular sub-pixels are sub-pixels of the first color.

20 Claims, 7 Drawing Sheets

(58) Field of Classification Search
USPC .......................................................... 345/694
See application file for complete search history.

(56) References Cited

U.S. PATENT DOCUMENTS

| | | | |
|---|---|---|---|
| 10,565,918 B2* | 2/2020 | Wu | H01L 27/3262 |
| 2005/0151709 A1* | 7/2005 | Jacobson | G02B 26/005 |
| | | | 345/84 |
| 2006/0087713 A1* | 4/2006 | Whitehead, Jr. | |
| | | | G02F 1/133514 |
| | | | 359/254 |
| 2006/0290870 A1 | 12/2006 | Kwak et al. | |
| 2007/0057901 A1* | 3/2007 | Chino | G09G 3/2003 |
| | | | 345/102 |
| 2007/0146509 A1* | 6/2007 | Hekstra | G09G 3/3413 |
| | | | 348/253 |
| 2009/0046082 A1* | 2/2009 | Jacobson | G02B 26/005 |
| | | | 345/204 |
| 2015/0070748 A1* | 3/2015 | Ishino | G02B 26/005 |
| | | | 359/290 |
| 2016/0042704 A1* | 2/2016 | Yin | G09G 3/3696 |
| | | | 345/695 |
| 2016/0275858 A1* | 9/2016 | Wang | H01L 27/32 |
| 2016/0300520 A1* | 10/2016 | Wang | G09F 9/30 |

FOREIGN PATENT DOCUMENTS

| | | |
|---|---|---|
| CN | 105355643 A | 2/2016 |
| CN | 106920832 A | 7/2017 |

OTHER PUBLICATIONS

International Search Report and Written Opinion for International Appl. No. PCT/CN2018/071551, dated Mar. 28, 2018.

* cited by examiner

PIXEL STRUCTURE, METHOD OF MANUFACTURING THE SAME, DISPLAY PANEL AND DISPLAY DEVICE

CROSS REFERENCE TO RELATED APPLICATIONS

The present application is a National Stage Application of International Application No. PCT/CN2018/071551, filed on Jan. 5, 2018, which claims priority to Chinese Patent Application No. 201710335252.3, filed on May 12, 2017, the disclosure of both of which is hereby incorporated by reference in its entirety.

TECHNICAL FIELD

The present application relates to a pixel structure, a method of manufacturing the same, a display panel and a display device.

BACKGROUND

In the related OLED (Organic Light Emitting Diode) display panel, the sub-pixels can be divided into red (R) sub-pixels, green (G) sub-pixels, and blue (B) sub-pixels according to the light emission color. Three adjacent R, B sub-pixels may constitute a pixel unit. The principle of color display of the OLED display panel is as follows: a sub-pixel emits light from an organic electroluminescent layer included therein, three (R, G and B) sub-pixels emit light of different brightness, since each pixel unit is very small, light emitted from three (R, G and B) sub-pixels may be visually mixed to form the color to be displayed by each pixel unit.

SUMMARY

According to some embodiments of the present disclosure, there is provided a pixel structure, where pixel structure comprise a plurality of pixel units, each of the plurality of pixel units comprises a plurality of sub-pixels, the plurality of sub-pixels are arranged in a manner of a matrix and each of the plurality of sub-pixels has a triangular shape, the plurality of sub-pixels have four different colors, each of the plurality of pixel units is a triangular structure composed of sub-pixels of four different colors; a sub-pixel of a first color in each of the plurality of pixel units is located at the center of the pixel unit, and sub-pixels of the other three colors are respectively located at three angles of the pixel unit, each of the sub-pixels of the other three colors has a common triangle edge with the sub-pixel of the first color respectively; any two sub-pixels in the pixel structure which have the same common triangle edge have different colors; each row and each column of sub-pixels are composed of alternately arranged upright triangle sub-pixels and inverted triangle sub-pixels; every adjacent six columns of sub-pixels constitute a group, each row of each group of sub-pixels comprises the sub-pixels of four different colors, and each group of sub-pixels are arranged in the same manner; and the upright triangle sub-pixels in each group of sub-pixels are respectively the sub-pixels of the other three different colors, and all of the inverted triangular sub-pixels are the sub-pixels of the first color.

In some embodiments, two rows of sub-pixels in every other row is arranged in the same manner.

In some embodiments, each of sub-pixels of the first color is only used by one pixel unit, and sub-pixels of the other three colors are commonly used by at least three different pixel units.

In some embodiments, two adjacent pixel units have one common sub-pixel.

In some embodiments, sub-pixels in each of the plurality of pixel units are only used by the pixel unit.

In some embodiments, the sub-pixel of the first color is a sub-pixel formed by laminating single-layer photoresists corresponding to regions of a plurality of adjacent sub-pixels.

In some embodiments, the first color includes white, purple, yellow or cyan.

In some embodiments, the other three colors are red, green and blue, respectively.

In some embodiments, the sub-pixels and the pixel units are all in the shape of equilateral triangles.

Some embodiments of the present disclosure further provide a display panel, including the above pixel structure provided in some embodiments of the present disclosure.

Some embodiments of the present disclosure further provide a display method of the above-described pixel structure according to some embodiments of the present disclosure. The method includes: controlling sub-pixels of a first color in each of the plurality of pixel units to perform an image grayscale display; and controlling sub-pixels of the first color which are not included in any of the plurality of pixel units to perform brightness adjustment display.

In some embodiments, two adjacent pixel units have one common sub-pixel of the same color to perform the image grayscale display.

Some embodiments of the present disclosure further provide a method of manufacturing the above pixel structure provided in some embodiments of the present disclosure. The method includes: forming photoresist patterns corresponding to regions of sub-pixels of four different colors in a pixel structure using three masks, such that any two adjacent sub-pixels have different colors.

In some embodiments, the forming photoresist patterns corresponding to regions of sub-pixels of four different colors in a pixel structure using three masks includes: forming all of red photoresist patterns corresponding to regions of red sub-pixels in the pixel structure using a first mask; forming all of green photoresist patterns corresponding to regions of green sub-pixels in the pixel structure using a second mask; and forming all of blue photoresist patterns corresponding to regions of blue sub-pixels in the pixel structure using a third mask, thereby obtaining the sub-pixels of four different colors in the pixel structure.

DETAILED DESCRIPTION

Figure 1:
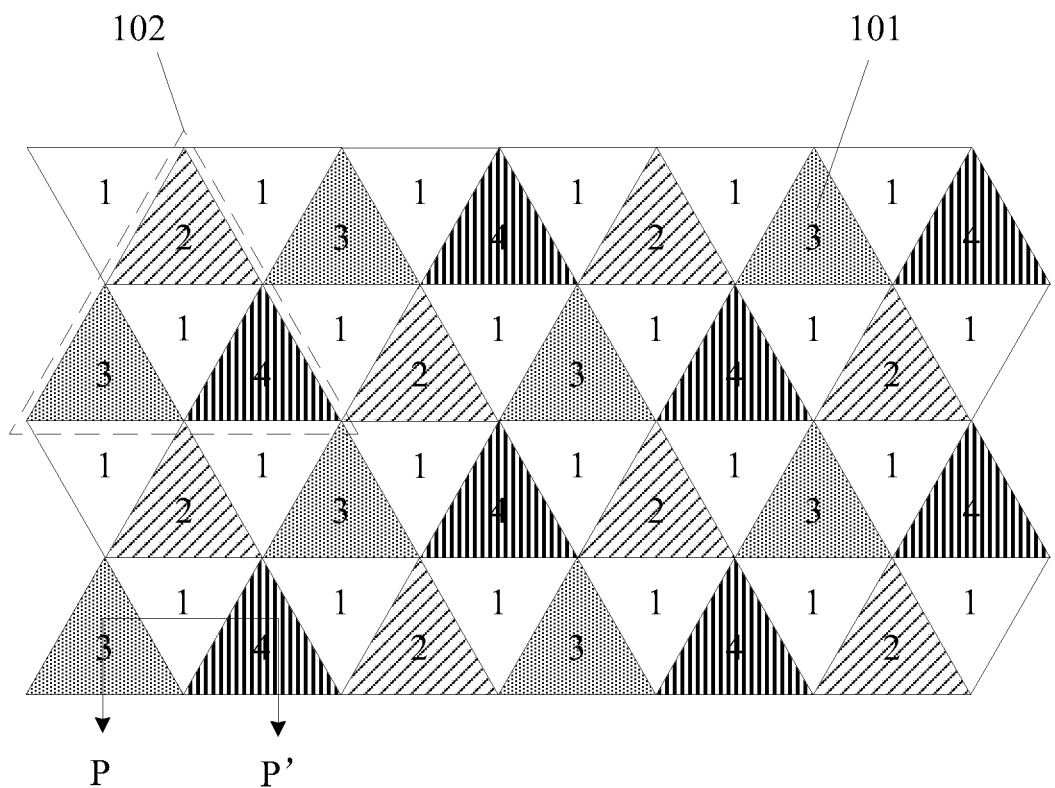
FIG. 1 is a partial structural schematic diagram of a pixel structure provided in some embodiments of the present disclosure.

Hereinafter, a clear and complete description will be given to the technical solution of some embodiments of the present disclosure with reference to the figures of some embodiments of the present disclosure. Obviously, merely some embodiments of the present disclosure, rather than all embodiments thereof, are given herein. All other embodiments obtained by those skilled in the art based on the embodiments of the present disclosure without inventive efforts shall fall within the protection scope of the present disclosure.

The size and the region shape of each structure in the drawings do not reflect the true scale thereof, and are only for a purpose of schematically illustrating the contents of the present disclosure.

A pixel structure provided in some embodiments of the present disclosure is mainly applicable to an OLED display panel. On the basis of the related pixel structures, the shape and the arrangement of sub-pixels are improved to arrange sub-pixels in the pixel structure more closely, so that the number of sub-pixels can be increased while the size of the display panel remains unchanged, thereby increasing the physical resolution of the display panel. The pixel structure, a method for manufacturing the same and a display panel provided in some embodiments of the present disclosure will be described in detail below, respectively.

FIG. 1 is a partial structural schematic diagram of a pixel structure provided in some embodiments of the present disclosure. The pixel structure provided in some embodiments of the present disclosure includes a plurality of sub-pixels 101 arranged in a manner of a matrix and each having a triangular shape, and a plurality of pixel units 102. As shown in FIG. 1, the pixel structure is only a part of the entire display panel, including 48 triangular sub-pixels, which can be regarded as a 4×12 matrix arrangement.

Specifically, the plurality of sub-pixels 101 have four different colors (the sub-pixels labeled by 1, 2, 3 and 4 in FIG. 1 respectively represent sub-pixels of four different colors, and are hereinafter referred to as sub-pixel of second color 2, sub-pixel of third color 3 and sub-pixel of fourth color 4 for convenience of description, respectively). Each of the plurality of pixel units 102 may consist of sub-pixels of four different colors which form a triangular structure (four sub-pixels surrounded by a dotted triangle 10 in FIG. 1 form a pixel unit). The sub-pixel of the first color 1 in each of the plurality of pixel units is located at the center of the pixel unit, and the sub-pixels of the other three colors 2, 3 and 4 are respectively located at the three angles of the pixel unit, which have a common triangle edge with the sub-pixel of the first color respectively.

Except forming a pixel unit by sub-pixels of four different colors, any two sub-pixels having the same common triangular edge have different colors. As shown in FIG. 1, 48 sub-pixels have four different colors. Since each of the sub-pixels has a triangular structure, a sub-pixel adjacent to any sub-pixel is a sub-pixel having the same common triangular edge with this sub-pixel. For example, assume that the sub-pixel at a position labeled by 101 in FIG. 1 is a target sub-pixel, the color of the target sub-pixel is represented by 3, the sub-pixels adjacent to the target sub-pixel are the sub-pixels having the same common triangular edges with the target sub-pixel, which in this case are three sub-pixels, all of which are sub-pixels of the first color 1 having different colors from that of the target sub-pixel. For example, the first color is white, and the second to fourth colors are red, green and blue, respectively.

Figure 2:
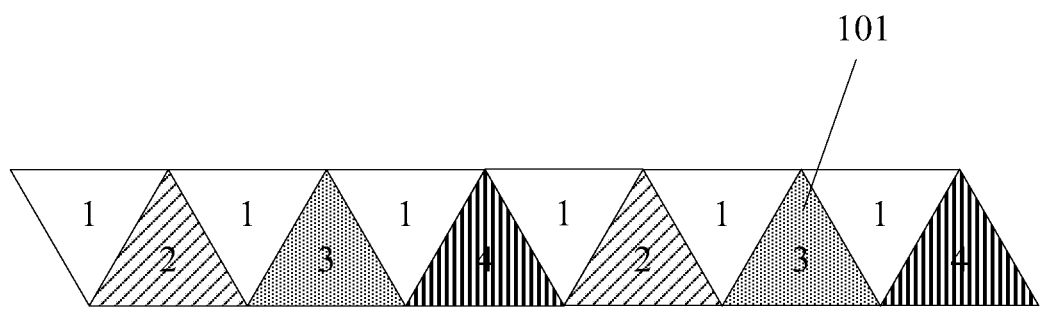
FIG. 2 is a structural schematic diagram of a first row of sub-pixels in FIG. 1 provided in some embodiments of the present disclosure.

The pixel structure in FIG. 1 includes 4 rows and 12 columns. Each row and each column of sub-pixels are composed of alternately arranged upright triangle sub-pixels and inverted triangle sub-pixels. In addition, every adjacent six columns of sub-pixels constitute a group. Each row in each group of sub-pixels includes sub-pixels of four different colors, and each group of sub-pixels has the same arrangement manner. The upright triangle sub-pixels in each group of sub-pixels are respectively sub-pixels of the other three different colors, and all of the inverted triangular sub-pixels are sub-pixels of the first color. FIG. 2 is a structural schematic diagram of a first row of sub-pixels in FIG. 1 provided in some embodiments of the present disclosure. The sub-pixels of the first color 1 in FIG. 2 are the inverted triangles, and the sub-pixels of the other three colors are the upright triangles. The upright triangles and the inverted triangles are arranged alternately. The arrangement of each of the other rows is similar, which will not be described herein.

Figure 3:
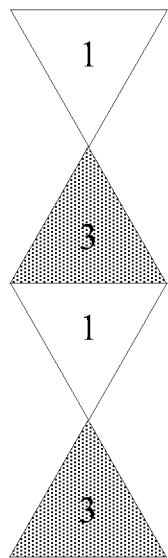
FIG. 3 is a structural schematic diagram of a first column of sub-pixels in FIG. 1 provided in some embodiments of the present disclosure.

FIG. 3 is a structural schematic diagram of a first column of sub-pixels in FIG. 1 provided in some embodiments of the present disclosure. The sub-pixels of the first color 1 in FIG. 3 are the inverted triangles, and the sub-pixels of the third color 3 are the upright triangles. The upright triangles and the inverted triangles are arranged alternately. The arrangement of each of the other columns is similar, which will not be described herein.

In a specific implementation, the sub-pixels in the pixel structure provided in some embodiments of the present disclosure have four different colors. Since each of the sub-pixels is arranged in a manner of a matrix and has a triangular shape, each row and each column of sub-pixels are upright triangles and inverted triangles which are alternately arranged, and any two adjacent sub-pixels have different colors. As compared to the related art, the sub-pixels in the pixel structure are arranged more closely, so that the number of sub-pixels can be increased while the size of the display panel remains unchanged, thereby increasing the physical resolution of the display panel.

Figure 4:
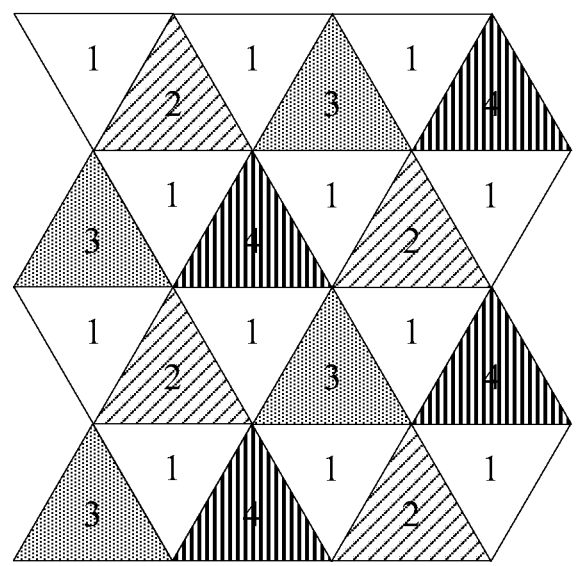
FIG. 4 is a structural schematic diagram of a group of sub-pixels provided in some embodiments of the present disclosure.

In addition, the pixel structure provided in some embodiments of the present disclosure is further repetitive. Every six adjacent columns of sub-pixels form a group. Each row of each group of sub-pixels includes sub-pixels of four different colors, and each group of sub-pixels has the same arrangement manner. The first six columns in FIG. 1 are taken as a first group, and the last six columns are taken as a second group, wherein each row of each group of sub-pixels includes sub-pixels of four colors, and the first group and the second group have the same arrangement manner. FIG. 4 is a structural schematic diagram of a group of sub-pixels provided in some embodiments of the present disclosure. FIG. 1 includes two groups of sub-pixels. FIG. 4 is a portion of FIG. 1. Of course, other different grouping manners are also possible. For example, starting from the second column, every six adjacent columns may be divided into a group, and the like. The specific grouping manners can be selected as necessary.

The pixel structure provided in some embodiments of the present disclosure have the following rules in its arrangement. Specifically, two rows of sub-pixels in every other row is arranged in the same manner. Therefore, the pixel structure provided in some embodiments of the present disclosure does not need to limit the number of rows when grouping, and may include one or more rows, because two rows of sub-pixels in every other row is arranged in the completely same manner. As shown in FIG. 1, the arrangement of the first row is the same as that of the third row in FIG. 1; the arrangement of the second row is the same as that of the fourth row. That is, two rows of sub-pixels in every other row located in the same column have the same color.

Since the pixel structure provided in the embodiment of the present disclosure is improved in terms of the shape and the arrangement of the sub-pixels, the sub-pixels in the pixel structure are arranged more closely, so that the number of sub-pixels can be increased while the size of the display panel remains unchanged, thereby increasing the physical resolution of the display panel.

In a specific implementation, in addition to improving the physical resolution of the display panel, the display resolution of the display panel may also be improved. In the pixel structure provided in some embodiments of the present disclosure, depending on different division manners of the pixel units, adjacent pixel units may have a common sub-pixel. In some embodiments, each of sub-pixels of the first color is only used by one pixel unit, and sub-pixels of the other three colors are commonly used by at least three different pixel units.

Figure 5A:
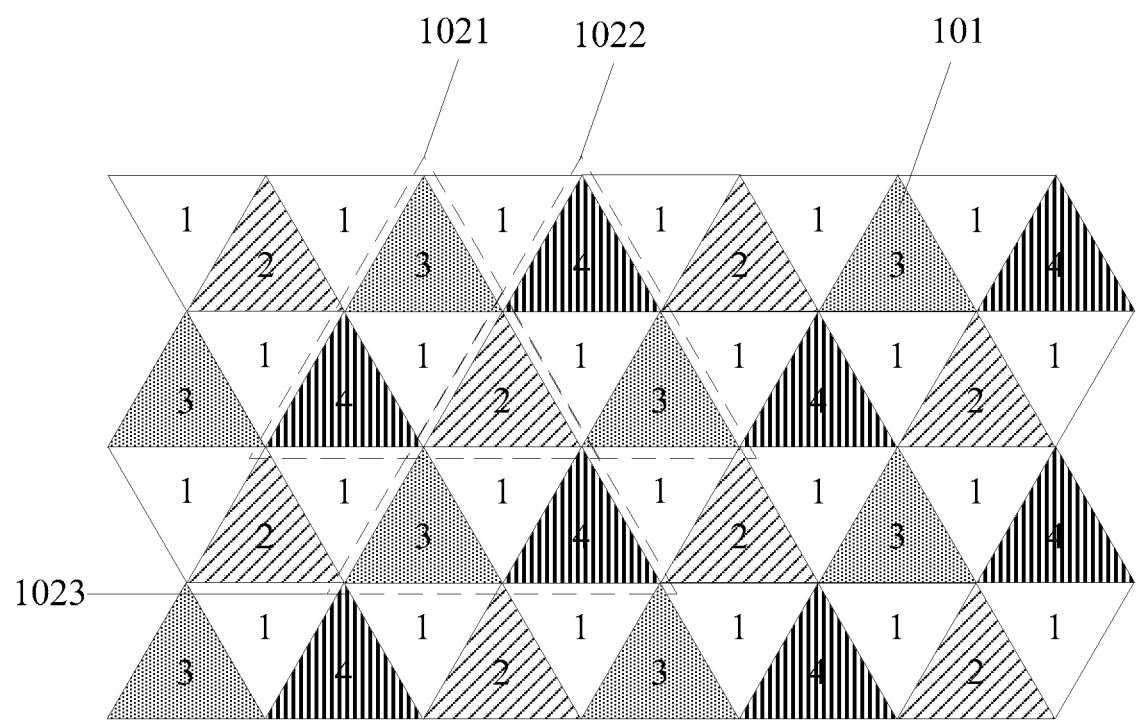
FIGS. 5a to 5d are schematic diagrams of different division manners of pixel units in a pixel structure provided in some embodiments of the present disclosure.

As shown in FIG. 5a, each of sub-pixels of the first color 1 may form a pixel unit with three adjacent sub-pixels of different colors, and each of sub-pixels of the first color is only used by one pixel unit. FIG. 5 includes 15 complete pixel units. Taking the pixel unit 1021, the pixel unit 1022 and the pixel unit 1023 surrounded by three triangular dotted boxes in FIG. 5 as an example, these three pixel units have the common sub-pixel of the second color 2. The other sub-pixels are in a similar condition, i.e., each of them may be divided as being commonly used by three different pixel units, which will be not described in detail herein.

In addition to each of sub-pixels of the other three colors being commonly used by at least three different pixel units, there may be a variety of other different division manners of the pixel units.

Specifically, two adjacent pixel units may have one common sub-pixel. The term "adjacent" means that there is an intersection between two adjacent pixel units, which may be adjacent in a left-right direction or in an up-down direction.

Figure 5B:
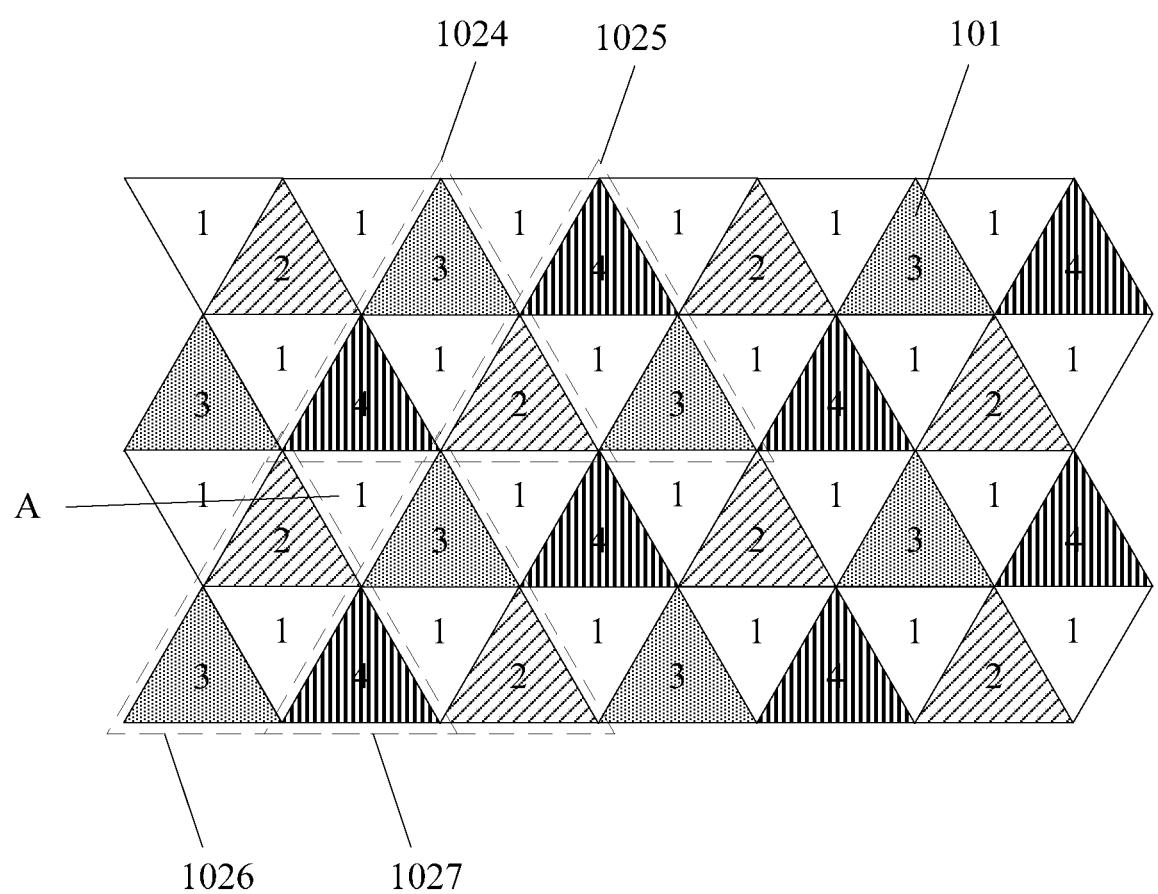

With respect to a left-right adjacent division manner, as shown in FIG. 5b, a pixel unit 1024 and a pixel unit 1025 are included in a first row and a second row, and these two pixel units have the common sub-pixel of the same color, that is, the sub-pixel of the second color 2; a pixel unit 1026 and a pixel unit 1027 are included in a third row and a fourth row, and these two pixel units have the common sub-pixel of the same color, that is, the sub-pixel of the fourth color 4; however, the sub-pixels in the second and the third rows do not form pixel units anyway. Therefore, in this case, there may be the remained extra sub-pixel of the first color, for example, a sub-pixel A in FIG. 5b, which does not form any pixel unit and is an extra sub-pixel. In an actual display process, when the sub-pixel of the first color is a white sub-pixel, it can be used to adjust the brightness of the display panel.

Figure 5C:
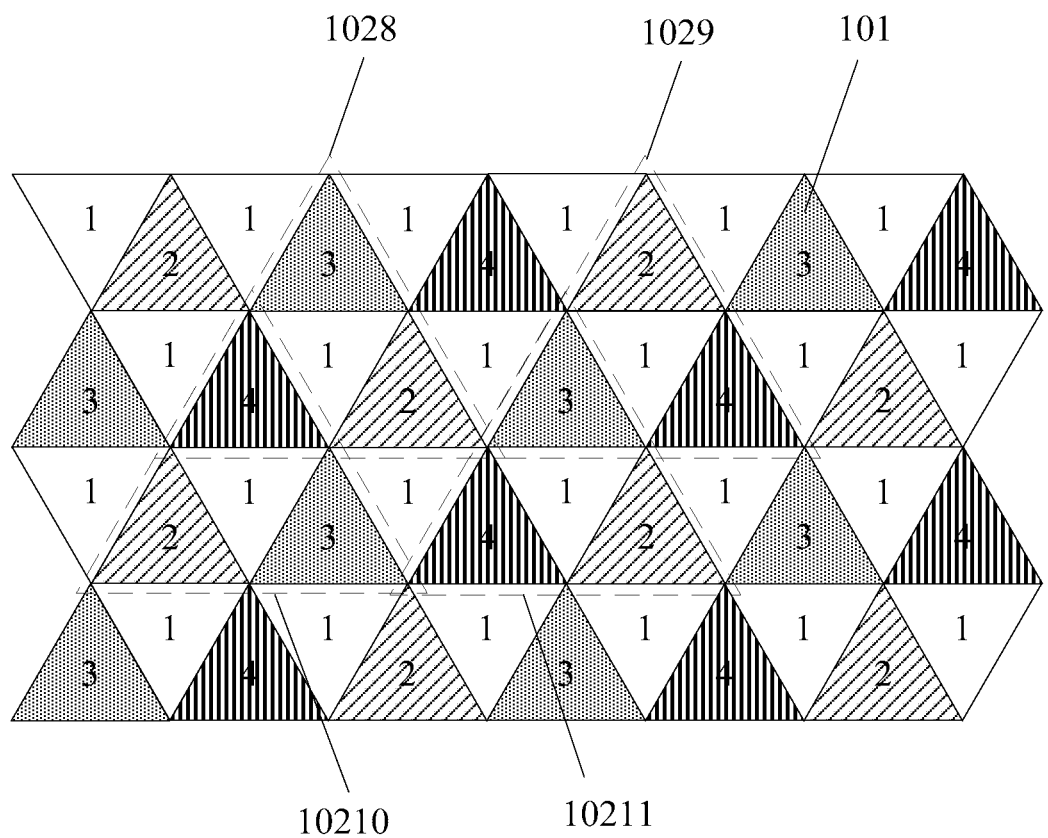

With respect to an up-down adjacent division manner, as shown in FIG. 5c, a pixel unit 1028 and a pixel unit 1029 are included in a first row and a second row, and these two pixel units do not have a common sub-pixel; a pixel unit 10210 and a pixel unit 10211 are included in a second row and a third row, and these two pixel units do not have a common sub-pixel, either; however, the pixel unit 1028 and the pixel unit 10210 are two up-down adjacent pixel units, which have the common sub-pixel of the fourth color 4 therebetween; the pixel unit 1029 and the pixel unit 10211 are two up-down adjacent pixel units, which have the common sub-pixel of the third color 3 therebetween. Extra sub-pixels which do not constitute any pixel units can be used to adjust the brightness of the display panel or to compensate for the corresponding colors in the actual display process.

Figure 5D:
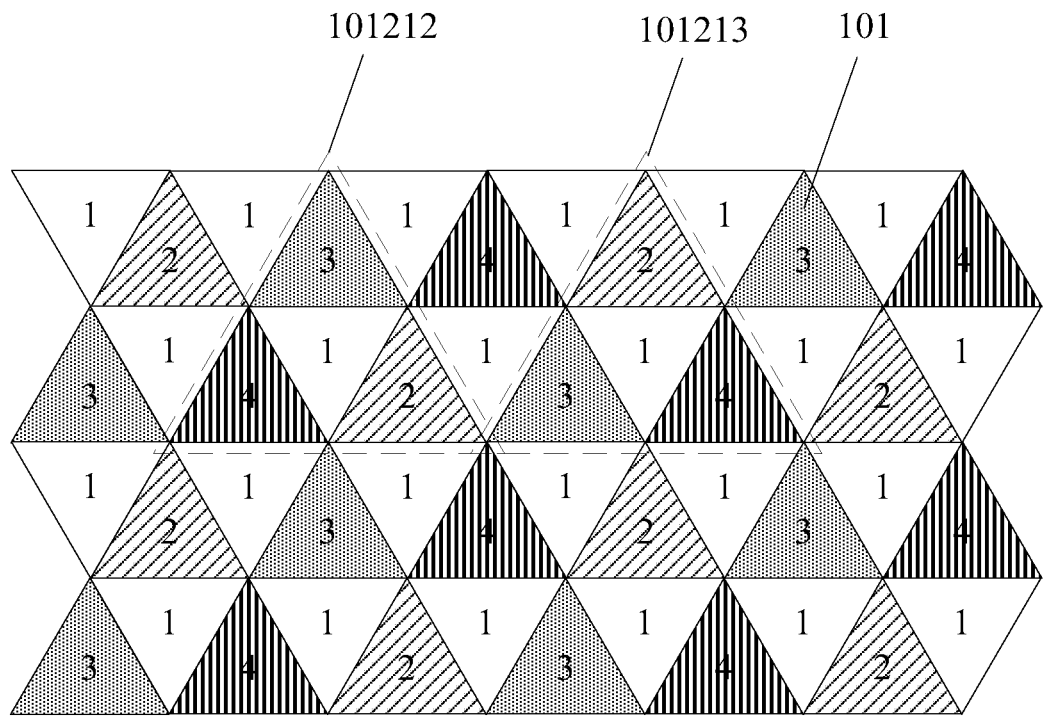

In addition, when dividing the pixel units, it can be also possible not to have a common sub-pixel between the pixel units as necessary. Specifically, all of the sub-pixels in each of the plurality of pixel units are only used by the pixel unit. As shown in FIG. 5d, a pixel unit 10212 and a pixel unit 10213 are included in a first row and a second row, and these two pixel units do not have a common sub-pixel therebetween. Thus, in this case, there are four extra sub-pixels remained. That is, three sub-pixels of the first color 1 and a sub-pixel of the fourth color 4 located between the pixel unit 10212 and the pixel unit 10213 in FIG. 5d do not constitute any pixel unit and are extra sub-pixels. In the actual display process, three sub-pixels of the first color 1 and the sub-pixel of the fourth color 4 may be used to adjust the brightness of the display panel or to compensate for a corresponding color (such as a color corresponding to the sub-pixel of the fourth color 4).

In a pixel structure provided in some embodiments of the present disclosure, when dividing the pixel units, all of sub-pixels of the other three colors than sub-pixels of the first color may be commonly used by the pixel units. Thus, the number of pixel units can be increased while the size of the display panel remains unchanged, thereby increasing the display resolution of the display panel.

In a specific implementation, in order to save the manufacturing processes, the sub-pixel of the first color may be a laminated sub-pixel. In some embodiments, the sub-pixel of the first color is a sub-pixel formed by laminating single-layer photoresists corresponding to regions of a plurality of adjacent sub-pixels.

As known by those skilled in the art, a photoresist of a corresponding color is disposed in a sub-pixel region. For example, a red color photoresist is disposed in a red sub-pixel region, a green color photoresist is disposed in a green sub-pixel region, and a blue color photoresist is disposed in a blue sub-pixel region, which will not be described in detail herein. In some embodiments of the present disclosure, through forming the sub-pixel of the first color by laminating a plurality of single-layer photoresists, the preparation processes and the preparation time for forming the sub-pixel of the first color can be saved, thereby improving the manufacturing efficiency of the pixel structure.

Specifically, the sub-pixel of the first color may function as a sub-pixel capable of compensating for a certain color. The particular color may be specified as necessary. In some embodiments, the first color includes white, purple, yellow or cyan. The other three colors are the basic three primary colors. In some embodiments, the other three colors are red, green and blue, respectively.

In order to compensate for blue light in the pixel structure, for the sub-pixel of the first color, single-layer photoresists of the R, G and B sub-pixels may be simultaneously vapor-deposited at the position where the sub-pixel of the first color is located, so as to obtain a white sub-pixel.

Alternatively, instead of vapor-depositing all of the three colors in the vapor deposition of the sub-pixels, two of them may be vapor-deposited, so that the white sub-pixel can be changed to other colors. Since the blue sub-pixels have lower luminous efficiency and a shorter lifetime among the current related sub-pixels, the sub-pixel of the first color can be set to compensate for purple and cyan, and thus compensate for the blue sub-pixels, so as to greatly improve the brightness of blue light and extend its service life. For example, single-layer photoresists of R and B sub-pixels may be vapor-deposited, or single-layer photoresists of G and B sub-pixels may be vapor-deposited.

In a specific implementation, in order to arrange the sub-pixels more closely, in some embodiments, the sub-pixels and the pixel units are all in the shape of equilateral triangles. As shown in FIG. 1 to FIG. 5d, all of the sub-pixels and the pixel units in the figures are structures of equilateral triangle.

Based on the same inventive concept, some embodiments of the present disclosure also provide a display panel including the above pixel structure provided in some embodiments of the present disclosure. For the implementation of the display panel, reference may be made to the embodiment of above-described pixel structure, and the repeated description will be omitted herein.

Based on the same inventive concept, some embodiments of the present disclosure also provide a display method of a pixel structure, which includes the following steps: controlling sub-pixels of a first color in each of the plurality of pixel units to perform an image grayscale display; and controlling sub-pixels of the first color which are not included in any of the plurality of pixel units to perform brightness adjustment display.

In a specific implementation, depending on different division manners of the pixel units, a sub-pixel of a first color may be divided into a pixel unit, or as shown in FIGS. 5b to 5d, there may be a case in which a sub-pixel of a first color does not belong to any of the plurality of pixel units. In this case, when displaying with this pixel structure, if the sub-pixel of the first color is divided into a pixel unit, the sub-pixel of the first color may be controlled to perform an image grayscale display; if the sub-pixel of the first color is not included in any of the plurality of pixel units, the sub-pixel of the first color may be controlled to perform a brightness adjustment display. For each of sub-pixels of the first color, its particular control, i.e., its control method varies depending on different division methods of the pixel units. Specifically, the sub-pixel of the first color is a white sub-pixel.

Furthermore, for the case where a sub-pixel is commonly used as shown in FIG. 5a to FIG. 5d, if a sub-pixel is commonly used by at least two pixel units, in some embodiments, the sub-pixel of the same color is commonly used by two adjacent pixel units to perform the image Grayscale display. In the actual display process of the pixel structure, it is necessary for the commonly used sub-pixel to comprehensively consider the display gray levels of two pixel units, so that two pixel units can achieve normal display.

Based on the same inventive concept, some embodiments of the present disclosure further provide a method for manufacturing the above pixel structure, including the following steps: forming photoresist patterns corresponding to regions of sub-pixels of four different colors in a pixel structure using three masks, such that any two adjacent sub-pixels have different colors. Photoresist patterns of sub-pixels of four different colors may be formed using three masks, thereby the number of masks can be saved, and the manufacturing cost can be saved, and the manufacturing process can be simplified.

Figure 6:
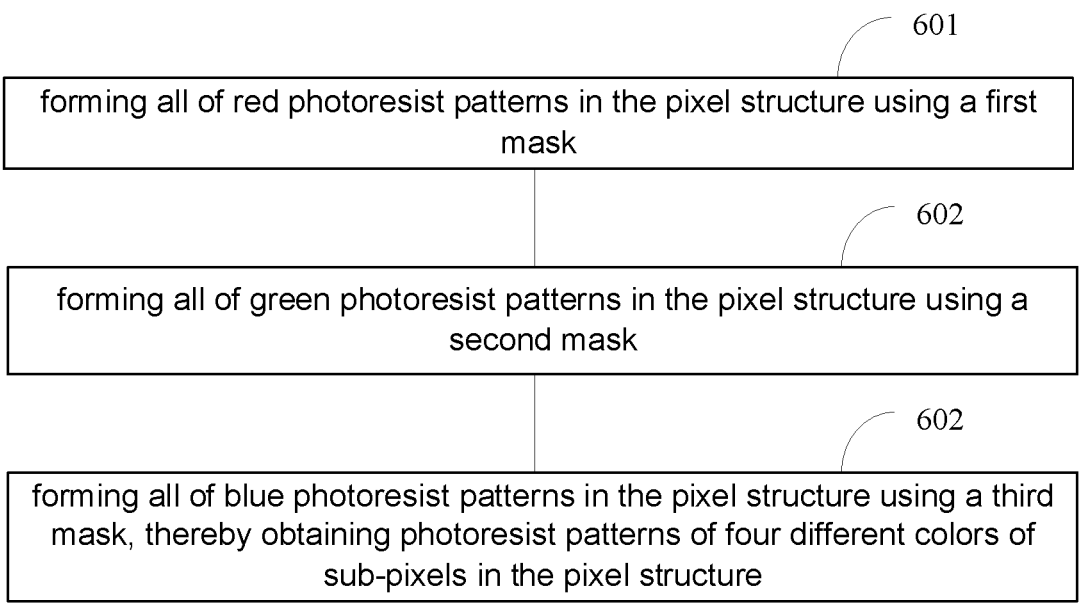
FIG. 6 is a flowchart of the steps of forming photoresist patterns corresponding to regions of sub-pixels of four different colors in the pixel structure using three masks according to some embodiments of the present disclosure.

FIG. 6 is a flowchart of the steps of forming photoresist patterns corresponding to regions of sub-pixels of four different colors in the pixel structure using three masks according to some embodiments of the present disclosure, which may be particularly implemented by the following steps:

step 601: forming all of red photoresist patterns corresponding to regions of red sub-pixels in the pixel structure using a first mask;

step 602: forming all of green photoresist patterns corresponding to regions of green sub-pixels in the pixel structure using a second mask; and step 603: forming all of blue photoresist patterns corresponding to regions of blue sub-pixels in the pixel structure using a third mask, thereby obtaining sub-pixels of four different colors in the pixel structure.

In a specific implementation, the present disclosure will be described with an example of forming single-layer photoresists of R, G and B sub-pixels and a sub-pixel of a first color using three masks. Since the sub-pixel of the first color is a sub-pixel formed by laminating single-layer photoresists corresponding to regions of a plurality of adjacent sub-pixels, a photoresist pattern in a region where the sub-pixel of the first color is located can be simultaneously manufactured when manufacturing the single-layer photoresists corresponding to the other sub-pixel regions, so that the preparation process and the preparation time of the sub-pixel of the first color can be saved and the manufacturing efficiency of the pixel structure can be improved.

Specifically, the specific sequence between steps 601, 602 and 603 may be set according to the pattern arrangement sequence of the photoresist stack in the region where the sub-pixel of the first color is located.

Figure 7:
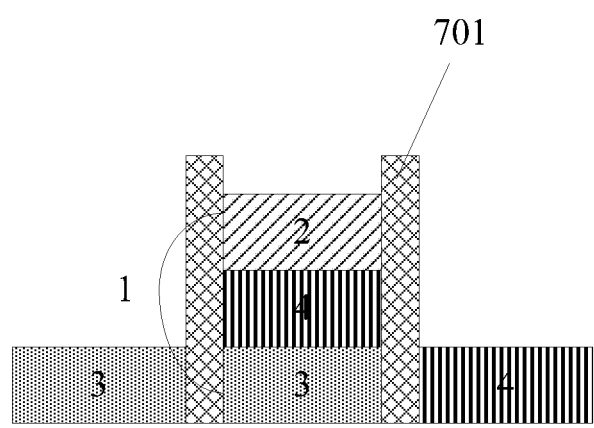
FIG. 7 is a schematic cross-sectional view taken along the P-P' direction in FIG. 1 according to some embodiments of the present disclosure.

FIG. 7 is a schematic cross-sectional view taken along the P-P' direction in FIG. 1 according to some embodiments of the present disclosure. In FIG. 7, a pixel defining layer for defining a light emitting region is indicated by 701, wherein a sub-pixel of a first color is formed by laminating single-layer photoresists of R, G and B sub-pixels. In the region where the sub-pixel of the first color is located, the single-layer photoresist of the R sub-pixel is located at the bottom layer, the single-layer photoresist of the G sub-pixel is located at the middle position, and the single-layer photoresist of the B sub-pixel is located at the top layer, and thus in practical manufacturing, it is necessary to perform manufacturing in the sequence of steps 601, 602 and 603. If the arrangement of the single-layer photoresist in the region where the sub-pixel of the first color is located changes, the sequence of steps 601, 602 and 603 should be changed accordingly.

To sum up, a pixel structure, a method for manufacturing the same and a display panel are provided in some embodiments of the present disclosure. Sub-pixels in the pixel structure have four different colors, and a triangular pixel unit is formed by sub-pixels of four different colors. Since the various sub-pixels are arranged in a manner of a matrix and all of them are in a triangular shape, each row and each column of sub-pixels comprises alternately arranged upright triangles and inverted triangles, such that any two sub-pixels having the same common triangular edge have different colors. Meanwhile, the pixel structure has a repetitive arrangement. Therefore, the sub-pixels in the pixel structure can be arranged more closely, so that the number of sub-pixels can be increased while the size of the display panel remains unchanged, thereby increasing the physical resolution of the display panel. Further, in the pixel structure provided in some embodiments of the present disclosure, all of sub-pixels of the other three colors than sub-pixels of the first color may be commonly used by different pixel units. Thus, the number of pixel units can be increased while the size of the display panel remains unchanged, thereby increasing the display resolution of the display panel.

An embodiment of the present disclosure further provides a display device including the display panel as described above. The display device may be any product or component having a display function, such as a liquid crystal display panel, an electronic paper, an OLED panel, a mobile phone, a tablet computer, a television set, a display, a notebook computer, a digital photo frame, a navigator, etc.

It will be apparent to those skilled in the art that various modifications and variations can be made to the embodiments of the present disclosure without departing from the spirit or scope of the present disclosure. In this case, if the modifications and variations made to the present disclosure fall within the scope of the claims of the present disclosure and equivalents thereof, the present disclosure is intended to comprise the modifications and variations.

What is claimed is:

1. A pixel structure, wherein the pixel structure comprises a plurality of pixel units, each of the plurality of pixel units comprises a plurality of sub-pixels, the plurality of sub-pixels are arranged in a manner of a matrix and each of the plurality of sub-pixels has a triangular shape, wherein:
   the plurality of sub-pixels have four different colors, each of the plurality of pixel units is a triangular structure composed of sub-pixels of four different colors;
   a sub-pixel of a first color in each of the plurality of pixel units is located at the center of the pixel unit, and sub-pixels of the other three colors are respectively located at three angles of the pixel unit, each of the sub-pixels of the other three colors has a common triangle edge with the sub-pixel of the first color respectively;
   any two sub-pixels in the pixel structure which have the same common triangle edge have different colors;
   each row and each column of sub-pixels are composed of alternately arranged upright triangle sub-pixels and inverted triangle sub-pixels;
   every adjacent six columns of sub-pixels constitute a group, each row of each group of sub-pixels comprises the sub-pixels of four different colors, and each group of sub-pixels are arranged in the same manner; and
   the upright triangle sub-pixels in each group of sub-pixels are respectively the sub-pixels of the other three different colors, and all of the inverted triangular sub-pixels are the sub-pixels of the first color.

2. The pixel structure according to claim 1, wherein two rows of sub-pixels in every other row are arranged in the same manner.

3. The pixel structure according to claim 1, wherein each of the sub-pixels of the first color is only used by one pixel unit, and the sub-pixels of the other three colors commonly used by at least three different pixel units.

4. The pixel structure according to claim 1, wherein two adjacent pixel units have one common sub-pixel.

5. The pixel structure according to claim 1, wherein the sub-pixels in each of the plurality of pixel units are only used by the pixel unit.

6. The pixel structure according to claim 1, wherein the sub-pixel of the first color is a sub-pixel formed by laminating single-layer photoresists corresponding to regions of a plurality of adjacent sub-pixels.

7. The pixel structure according to claim 1, wherein the first color includes white, purple, yellow or cyan.

8. The pixel structure according to claim 1, wherein the other three colors than the first color are red, green and blue, respectively.

9. The pixel structure according to claim 1, wherein the sub-pixels and the pixel units are all in the shape of equilateral triangles.

10. A display panel, comprising the pixel structure according to claim 1.

11. A display device, comprising the display panel according to claim 10.

12. The display panel according to claim 10, wherein two rows of sub-pixels in every other row are arranged in the same manner.

13. A display method of a pixel structure, wherein the pixel structure comprises a plurality of pixel units, each of the plurality of pixel units comprises a plurality of sub-pixels, the plurality of sub-pixels are arranged in a manner of a matrix and each of the plurality of sub-pixels has a triangular shape, the plurality of sub-pixels have four different colors, each of the plurality of pixel units is a triangular structure composed of sub-pixels of four different colors; a sub-pixel of a first color in each of the plurality of pixel units is located at the center of the pixel unit, and sub-pixels of the other three colors are respectively located at three angles of the pixel unit, each of the sub-pixels of the other three colors has a common triangle edge with the sub-pixel of the first color respectively; any two sub-pixels in the pixel structure which have the same common triangle edge have different colors; each row and each column of sub-pixels are composed of alternately arranged upright triangle sub-pixels and inverted triangle sub-pixels; every adjacent six columns of sub-pixels constitute a group, each row of each group of sub-pixels comprises the sub-pixels of four different colors, and each group of sub-pixels are arranged in the same manner; and the upright triangle sub-pixels in each group of sub-pixels are respectively the sub-pixels of the other three different colors, and all of the inverted triangular sub-pixels are the sub-pixels of the first color, the method comprising:
   controlling sub-pixels of the first color in each of the plurality of pixel units to perform an image grayscale display; and
   controlling sub-pixels of the first color which are not comprised in any of the plurality of pixel units to perform brightness adjustment display.

14. The display method according to claim 13, wherein two adjacent pixel units have one common sub-pixel of the same color to perform the image grayscale display.

15. The display method according to claim 13, wherein two rows of sub-pixels in every other row are arranged in the same manner.

16. The display method according to claim 13, wherein each of the sub-pixels of the first color is only used by one pixel unit, and the sub-pixels of the other three colors are commonly used by at least three different pixel units.

17. A method of manufacturing a pixel structure, wherein the pixel structure comprises a plurality of pixel units, each of the plurality of pixel units comprises a plurality of sub-pixels, the plurality of sub-pixels are arranged in a manner of a matrix and each of the plurality of sub-pixels has a triangular shape, the plurality of sub-pixels have four different colors, each of the plurality of pixel units is a triangular structure composed of sub-pixels of four different colors; a sub-pixel of a first color in each of the plurality of pixel units is located at the center of the pixel unit, and sub-pixels of the other three colors are respectively located at three angles of the pixel unit, each of the sub-pixels of the other three colors has a common triangle edge with the sub-pixel of the first color respectively; any two sub-pixels in the pixel structure which have the same common triangle edge have different colors; each row and each column of sub-pixels are composed of alternately arranged upright triangle sub-pixels and inverted triangle sub-pixels; every adjacent six columns of sub-pixels constitute a group, each row of each group of sub-pixels comprises the sub-pixels of four different colors, and each group of sub-pixels are arranged in the same manner; and the upright triangle sub-pixels in each group of sub-pixels are respectively the sub-pixels of the other three different colors, and all of the inverted triangular sub-pixels are the sub-pixels of the first color, the method comprising:

forming photoresist patterns corresponding to regions of sub-pixels of four different colors in the pixel structure using three masks, thereby obtaining the sub-pixels of four different colors in the pixel structure.

18. The method according to claim 17, wherein the forming photoresist patterns corresponding to regions of sub-pixels of four different colors in the pixel structure using three masks comprises:

forming all of red photoresist patterns corresponding to regions of red sub-pixels in the pixel structure using a first mask;

forming all of green photoresist patterns corresponding to regions of green sub-pixels in the pixel structure using a second mask; and forming all of blue photoresist patterns corresponding to regions of blue sub-pixels in the pixel structure using a third mask, thereby obtaining the sub-pixels of four different colors in the pixel structure.

19. The method according to claim 17, wherein two rows of sub-pixels in every other row are arranged in the same manner.

20. The method according to claim 17, wherein each of the sub-pixels of the first color is only used by one pixel unit, and the sub-pixels of the other three colors are commonly used by at least three different pixel units.

\* \* \* \* \*